United States Patent
Cohen et al.

(10) Patent No.: US 9,445,528 B2
(45) Date of Patent: Sep. 13, 2016

(54) THERMAL GAP PAD

(71) Applicant: Apple Inc., Cupertino, CA (US)

(72) Inventors: Sawyer I. Cohen, Sunnyvale, CA (US); David A. Pakula, San Francisco, CA (US); Tseng-Mau Yang, Mississaugua (CA); Tyler B. Cater, Cupertino, CA (US); Ashutosh Y. Shukla, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/323,874

(22) Filed: Jul. 3, 2014

(65) Prior Publication Data

US 2016/0004284 A1 Jan. 7, 2016

Related U.S. Application Data

(63) Continuation of application No. PCT/US2014/045391, filed on Jul. 3, 2014.

(51) Int. Cl.
*H05K 7/20* (2006.01)
*F28F 21/02* (2006.01)
*G06F 1/20* (2006.01)
*F28F 21/06* (2006.01)

(52) U.S. Cl.
CPC .......... *H05K 7/20454* (2013.01); *F28F 21/02* (2013.01); *F28F 21/067* (2013.01); *G06F 1/20* (2013.01); *H05K 7/20481* (2013.01)

(58) Field of Classification Search
CPC .......... H05K 7/2039; H05K 7/20472; H05K 7/20481; H05K 7/20954–7/20963; G06F 1/20; B32B 37/12; B32B 37/142; B32B 37/182; B32B 38/0012; B32B 2375/00; B32B 2305/022; B32B 2307/302; B32B 2457/00; F28F 21/067; F28F 21/02
USPC ........................ 361/679.46–679.54, 688–723, 361/679.55–679.56; 455/575.1
See application file for complete search history.

(56) References Cited

U.S. PATENT DOCUMENTS

| | | | |
|---|---|---|---|
| 7,025,129 B2* | 4/2006 | Chiu | 165/185 |
| 7,682,690 B2 | 3/2010 | Bunyan et al. | |
| 7,737,550 B2* | 6/2010 | MacQuarrie | H01L 23/3675 257/712 |

(Continued)

FOREIGN PATENT DOCUMENTS

EP       0844509 A2    5/1998

OTHER PUBLICATIONS

International Search Report and Written Opinion mailed Feb. 27, 2015 for PCT Application No. PCT/US2014/045391.

*Primary Examiner* — Zachary M Pape

(57) ABSTRACT

This application relates to efficiently distributing heat within a portable computing device. More specifically an apparatus for conducting heat between internal components of the portable computing device is disclosed. The apparatus, referred to as a thermal gap pad, is configured to bridge a variably sized gap between internal components. This is accomplished by wrapping a resilient core in a layer of highly thermally conductive material. The resilient core allows a shape of the thermal gap pad to vary in accordance with a size of the gap. A resilience of the thermal gap pad can be adjusted to account for an amount of variance in the gap. In some embodiments, an electrically conductive layer can be added to facilitate the passage of electrical current through the thermal gap pad.

18 Claims, 9 Drawing Sheets

(56) References Cited

U.S. PATENT DOCUMENTS

| | | | |
|---|---|---|---|
| 7,954,236 B2* | 6/2011 | Lundell | H01L 23/433 |
| | | | 165/185 |
| 8,432,696 B2* | 4/2013 | Ribas et al. | 361/714 |
| 2003/0128519 A1* | 7/2003 | Justo et al. | 361/704 |
| 2008/0190584 A1 | 8/2008 | Lundell et al. | |
| 2010/0142154 A1* | 6/2010 | Collet et al. | 361/714 |
| 2011/0176279 A1 | 7/2011 | Zhao et al. | |
| 2012/0026770 A1* | 2/2012 | West | 363/131 |
| 2012/0155029 A1 | 6/2012 | Wong et al. | |
| 2013/0058039 A1* | 3/2013 | Lee | H04M 1/03 |
| | | | 361/690 |
| 2014/0332193 A1* | 11/2014 | Oh | H05K 7/20454 |
| | | | 165/185 |

* cited by examiner

THERMAL GAP PAD

CROSS REFERENCE TO RELATED APPLICATIONS

This application is a continuation of International Application No. PCT/US14/45391, with an international filing date of Jul. 3, 2014, entitled "THERMAL GAP PAD," which is incorporated herein by reference in its entirety for all purposes.

FIELD

The described embodiments relate generally to methods and apparatus for providing thermally conductive pathways in a computing device. More particularly, a variable height, thermal gap pad is described suitable for creating a thermally conductive pathway between heat emitting components.

BACKGROUND

As portable computing devices become more advanced, higher processing demands required to deliver advanced features produce increasingly greater amounts of heat. When the portable computing devices do not include active cooling devices, such as for example fans, heat can become trapped in isolated areas of the device in which the heat is generated. For example, when different subassemblies of the device are not in direct contact (e.g. separated by an air gap), heat transfer is limited to convection and radiation. While these two forms of heat transfer are generally acknowledged to be substantially less efficient than thermal conduction, the lack of a fan to circulate air through the device further reduces the efficiency of convective heat transfer. Consequently, devices with components that generate heat that are separated from other portions of the device will generally be unable to distribute heat throughout the device in an efficient manner. This deficiency can limit the amount of heat safely generated by such a device and in turn limit an amount of time the device can operate at peak operating speeds.

While it should be noted that highly thermally conductive sheets are available and in use for spreading heat across a surface of a subassembly, these thermally conductive sheets are most efficient at transferring heat in plane and thus are not well suited for use as a means for bridging a gap between separated subassemblies of a device.

SUMMARY

This paper describes various embodiments that relate to methods and apparatus for distributing heat within a portable computing device.

A heat transfer composite structure is disclosed. The heat transfer composite provides a thermal path for a transfer of heat in an electronic device. The heat transfer composite includes at least the following: a resilient bulk portion including a substrate formed of a material that is thermally insulating; and a laminate structure that promotes efficient heat transfer along the thermal path, the laminate structure including a thermally conductive layer sealed within a flexible wrapper. The laminate structure is wrapped around and adhered to the resilient bulk portion in a manner that defines the thermal path.

A computing device is disclosed. The computing device includes at least the following: a first component; a second component, separated from the first component by a gap; and a thermal gap pad disposed within the gap between the first component and the second component. The thermal gap pad includes at least the following: a resilient core, and a thermally conductive layer wrapped around the resilient core. The thermally conductive layer conducts heat between the first and second components.

A method of forming a thermal gap pad suitable for use in a portable computing device is disclosed. The method includes at least the following steps: encasing a thermally conductive substrate within a flexible wrapper to form a thermally conductive layer; applying an adhesive to one surface of the thermally conductive layer; wrapping the thermally conductive layer around a resilient core so that the applied adhesive couples the thermally conductive layer along an outside surface of the resilient core to form the thermal gap pad; and applying an arc shaped tool to an outside surface of the flexible wrapper during the wrapping to form a protruding curved surface that reduces collapse of a central portion of the thermal gap pad when the thermal gap pad is subjected to compression.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
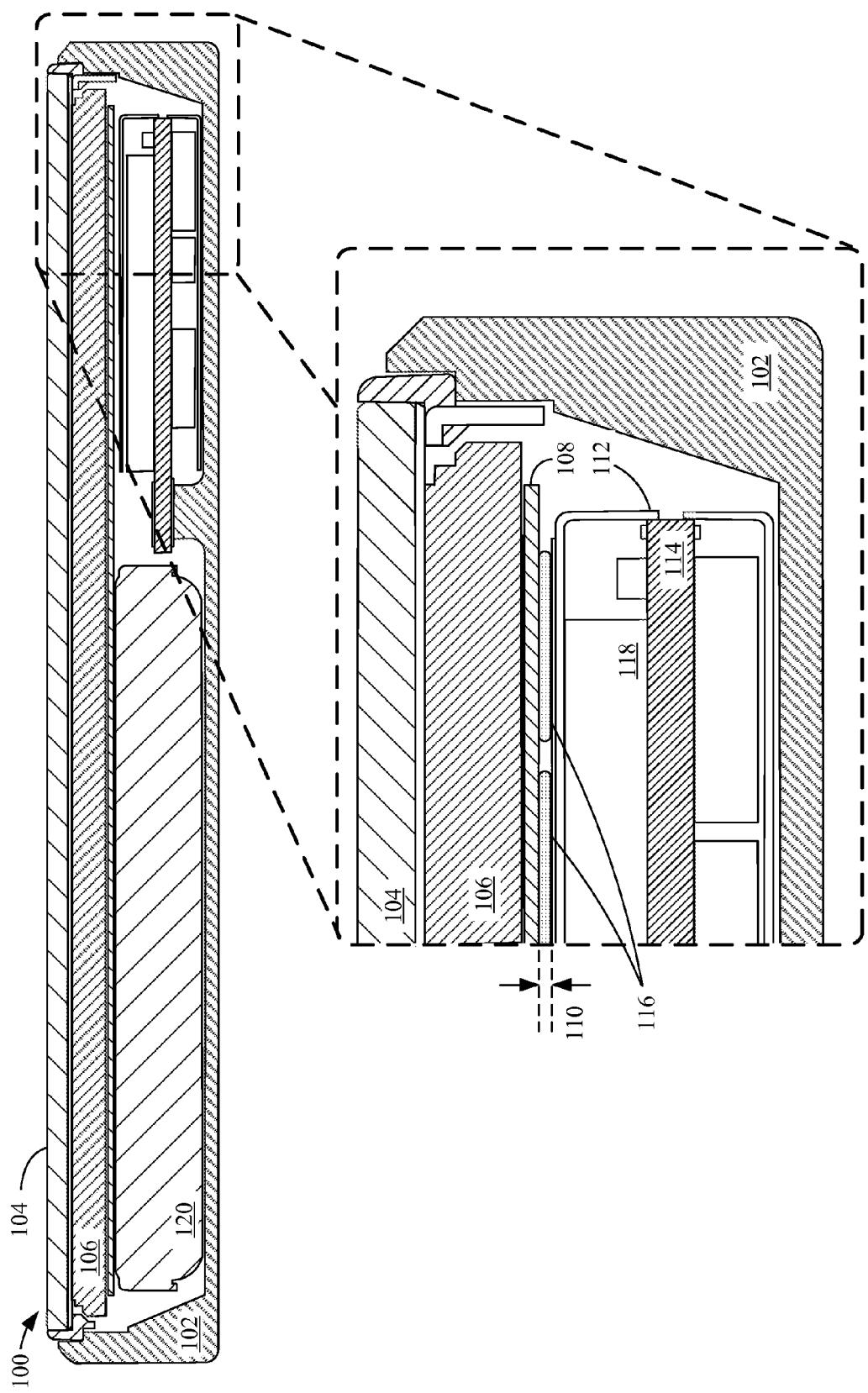
FIG. 1A shows a cross-sectional view of an electronic device suitable for use with the described embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

In circumstances where spacing between various internal components is subject to change, placing components in thermally conductive contact can be problematic at best. For example, when a device contains two separate component assemblies, the two assemblies may not always be separated by a fixed distance. Tolerances may be loose enough that simply placing a thermally conductive layer atop one of the assemblies would be insufficient to reliably place the component stacks into efficient thermally conductive contact. For example, if the layer were too thick the assemblies might not have enough vertical height within the device, while if the layer were too short the assemblies might not come into direct contact, thereby preventing thermally conductive contact between the component assemblies. Unfortunately, materials having high thermal conductivity do not tend to be compliant or resilient and therefore are not well suited for bridging a gap having an uncertain or variable dimension. The discussed lack of thermally conductive pathways allowing heat to be spread to other component assemblies can be even more problematic when a housing assembly that includes a processor is involved. Because the processor is continuously monitored and operates more efficiently at lower temperatures, efficient heat rejection is important to maintain satisfactory performance of the processor.

One solution to this problem is to create a resilient, thermally conductive member by wrapping a layer of thermally conductive material around a core or bulk of conformable and/or resilient material. The thermally conductive member can be arranged between the aforementioned assemblies so that it provides a robust heat conduction path between the two assemblies. The thermally conductive member or thermal gap pad can be utilized to form a thermally conductive pathway between the assemblies. In one specific embodiment, a foam core can be wrapped in a layer of synthetic graphite. The synthetic graphite layer can be formed from a specific type of synthetic graphite referred to as a Pyrolytic Highly Oriented Graphite Sheet (PGS) which has an extremely high thermal conductivity that can be as high as about 2000 W/m K. In this way, the foam can take on a vertical height of whatever space is available to it, while the synthetic graphite layer can efficiently conduct heat between the two component assemblies. Because foam is a thermal insulator the transfer of heat along the thermal gap pad can be concentrated primarily along the layer or sheet of synthetic graphite, substantially bypassing the foam core. Because the foam is resilient it also tends to exert a force upon the thermally conductive material, thereby improving a thermal coupling between the thermally conductive material and the two component assemblies.

In a particular embodiment, a heat transfer composite structure (also referred to as the thermal gap pad) that is both compliant and highly thermally conductive can be formed from polyurethane foam, sheets of PGS and polyethylene terephthalate (PET) or similar polymer. The heat transfer composite structure can include laminated structure defining a sealed pocket used to retain graphite dust from the sheets of PGS. The sealed pocket can therefore prevent any of the graphite dust from escaping into a finished product. The sealed pocket can be formed by laminating a layer or layers of PGS between layers of (PET). In this way, the PET layers can overlap the PGS layer on all sides ensuring that the pocket is completely sealed. In some embodiments, a strip of polyurethane foam (or similarly compliant material) can be attached to the sealed pocket using a second adhesive. The sealed pocket can then be wrapped around and adhered to a foam strip forming the heat transfer composite structure. It should be noted that the wrapping and adhering of the sealed pocket to the foam substrate can cause the foam substrate to take on an appropriate shape. For example, the foam substrate can take on a 'D' shape having an arc on a top side opposite the adhesive. In this way, any collapse of the center section of the heat transfer composite structure during compression can be avoided. It should also be noted that the heat transfer composite structure can be attached to a product using an additional adhesive layer.

A number of alternative embodiments are also discussed. For example, the thermal gap pad can be wrapped in an electrically conductive layer to facilitate electrical communication or at least grounding between the component assemblies. Also the thermal gap pad can be formed with a heat spreading pad so that heat disposed along a surface area covered by the heat spreading pad moves towards the thermal gap pad to be transferred to another cooler component assembly.

These and other embodiments are discussed below with reference to FIGS. 1A-7; however, those skilled in the art will readily appreciate that the detailed description given herein with respect to these figures is for explanatory purposes only and should not be construed as limiting.

FIG. 1A shows a cross-sectional view of an exemplary electronic device 100 suitable for use with the described embodiments. Electronic device 100 includes a housing 102 and a protective cover 104 that overlays a display assembly 106. Housing 102 can include a number of walls that define a cavity or internal volume within which a number of electrical components can be positioned. Display assembly 106 is covered by a retaining plate, depicted in FIG. 1A as midplate 108 that at least in part secures display assembly 106 to protective cover 104. In some embodiments, protective cover 104 can be a layer of coverglass and display assembly 106 can include components such as a display unit overlaid by a touch sensitive sensor. Because display assembly 106 is secured to protective cover 104 by midplate 108 and suspended within a front opening defined by housing 102, display assembly 106 may not share a reference plane with internal components attached to an interior wall of housing 102. For this reason, a distance 110 between a bottom surface of midplate 108 and a top surface of cowling 112 of printed circuit board (PCB) 114 can be somewhat variable. For this reason, distance 110 is generally large enough to account for any variability in a vertical position of display assembly 106. In one specific embodiment, a variability of distance 110 can be on the order of about 0.05 mm. By positioning resilient, thermal gap pads 116 between cowling 112 and midplate 108, a thermally conductive pathway can be created that can accommodate a range of distances 110 and in some embodiments can also accommodate movement between the cowling 112 and midplate 108 after assembly is complete. For example, a vertical position of display assembly 106 when it is face down may be slightly different than when it is face up. It should be noted that while heat emitting body 118 (sometimes embodied as an integrated circuit) is shown in direct contact with cowling 112, in some embodiments where heat emitting body is not in direct contact with cowling 112, heat emitted from heat emitting body 118 can be conducted through PCB 114 to cowling 112. Similarly, heat from other heat emitting components disposed on a bottom surface of PCB 114 can be thermally conducted through PCB 114 to cowling 112. In this way, when display assembly 106 is cooler than the components mounted to PCB 114, heat can be efficiently transferred to display assembly 106. It should be noted that in some embodiments, thermal gap pads 116 can also be added between midplate 108 and battery 120; however, it should be noted that by limiting the thermal gap pads 116 to locations between midplate 108 and cowling 112 offloading heat from cowling 112 can be prioritized over offloading heat from battery 120.

Figure 1B:
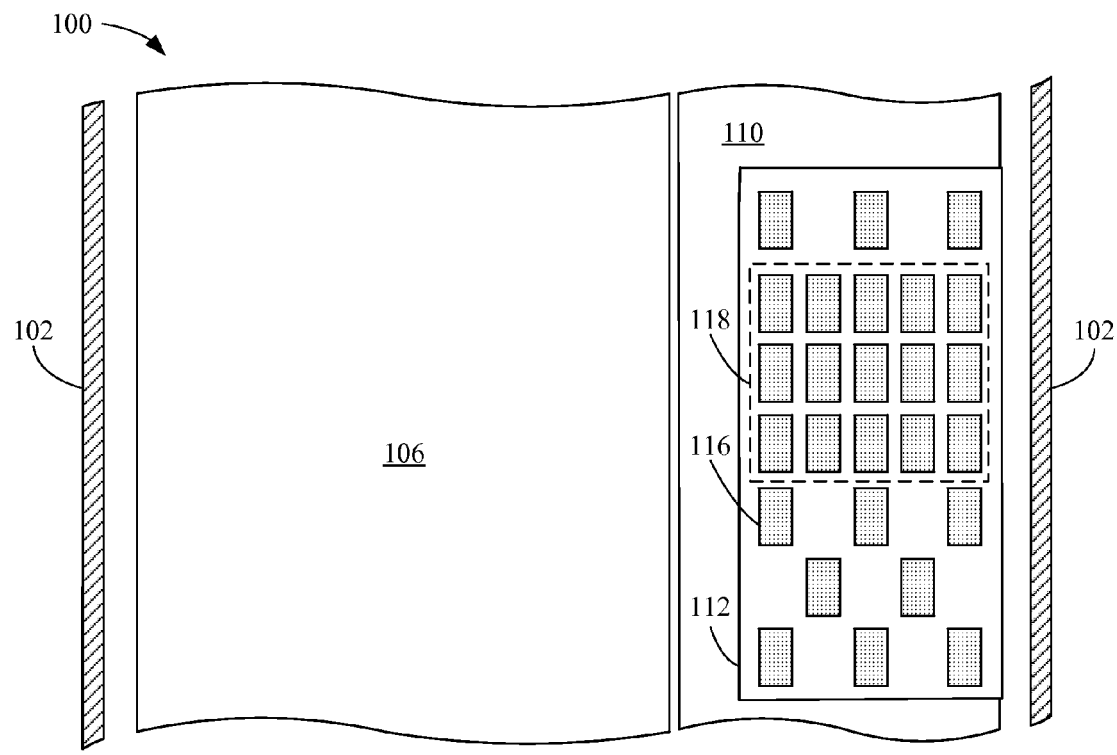
FIGS. 1B-1C show how thermal gap pads can be arranged across the electronic device depicted in FIG. 1A to distribute heat across the electronic device.
Figure 1C:
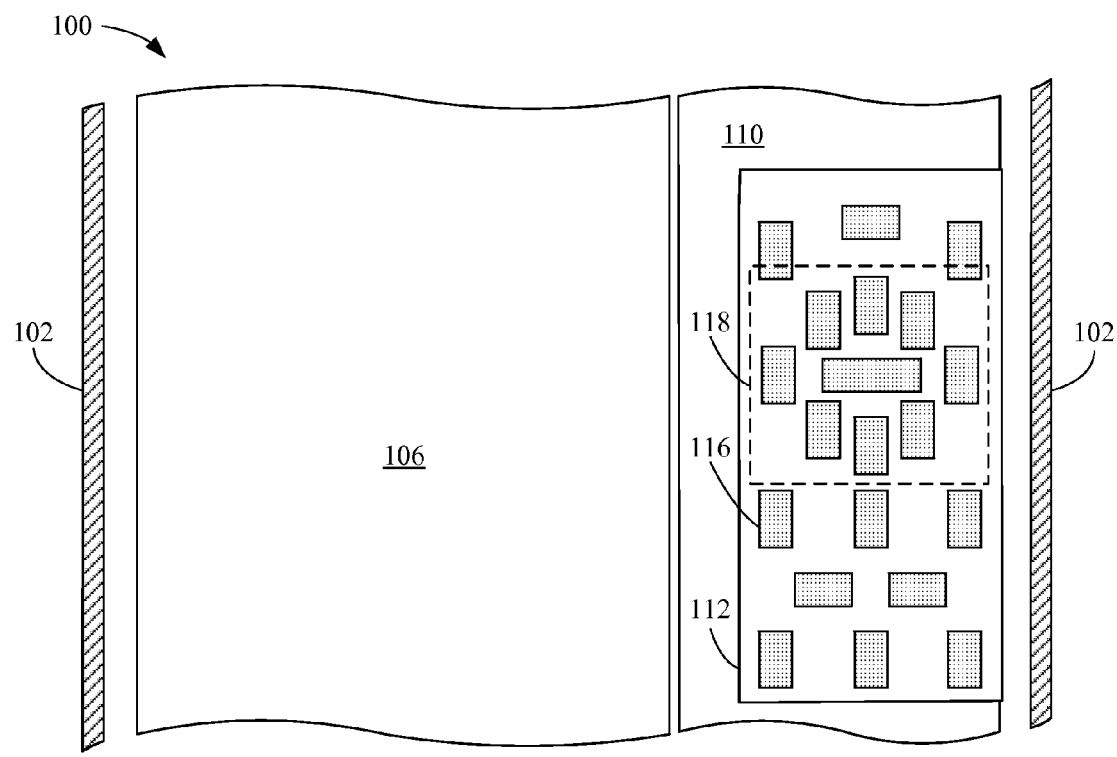

FIGS. 1B-1C show partial internal top views of electronic device 100. FIG. 1B shows how thermal gap pads 116 can be arranged atop cowling/electromagnetic interference (EMI) shield 112. Furthermore, FIG. 1B shows how a density of thermal gap pads 116 can be altered to account for a distribution of heat emitting members. For example, in this depiction, heat emitting member 118 can represent an integrated circuit along the lines of a central processing unit. When heat emitting member 118 is in direct contact with cowling 112, a substantial amount of heat would be transferred to the portion of the cowling overlaying heat emitting member 118. As such, the density of thermal gap pads 116 is greater over heat emitting member 118 when compared with the density of thermal gap pads 116 farther away from heat emitting member 118. FIG. 1C shows how thermal gap pads 116 can be disposed at different orientations to account for a distribution of heat across cowling 112. FIG. 1C also shows how some of thermal gap pads 116 can have different lengths. In some embodiments, an amount of heat emitted by electrical components disposed beneath cowling 112 can be used to arrange thermal gap pads 116. For example, in this depiction, an arrangement of thermal gap pads 116 is distributed more densely over a central portion of heat emitting member 118. It should be noted that in some embodiments a top surface of cowling 112 can be covered with a thermally conductive layer, thereby allowing heat to be quickly and evenly distributed to the thermal gap pads.

Figure 2A:
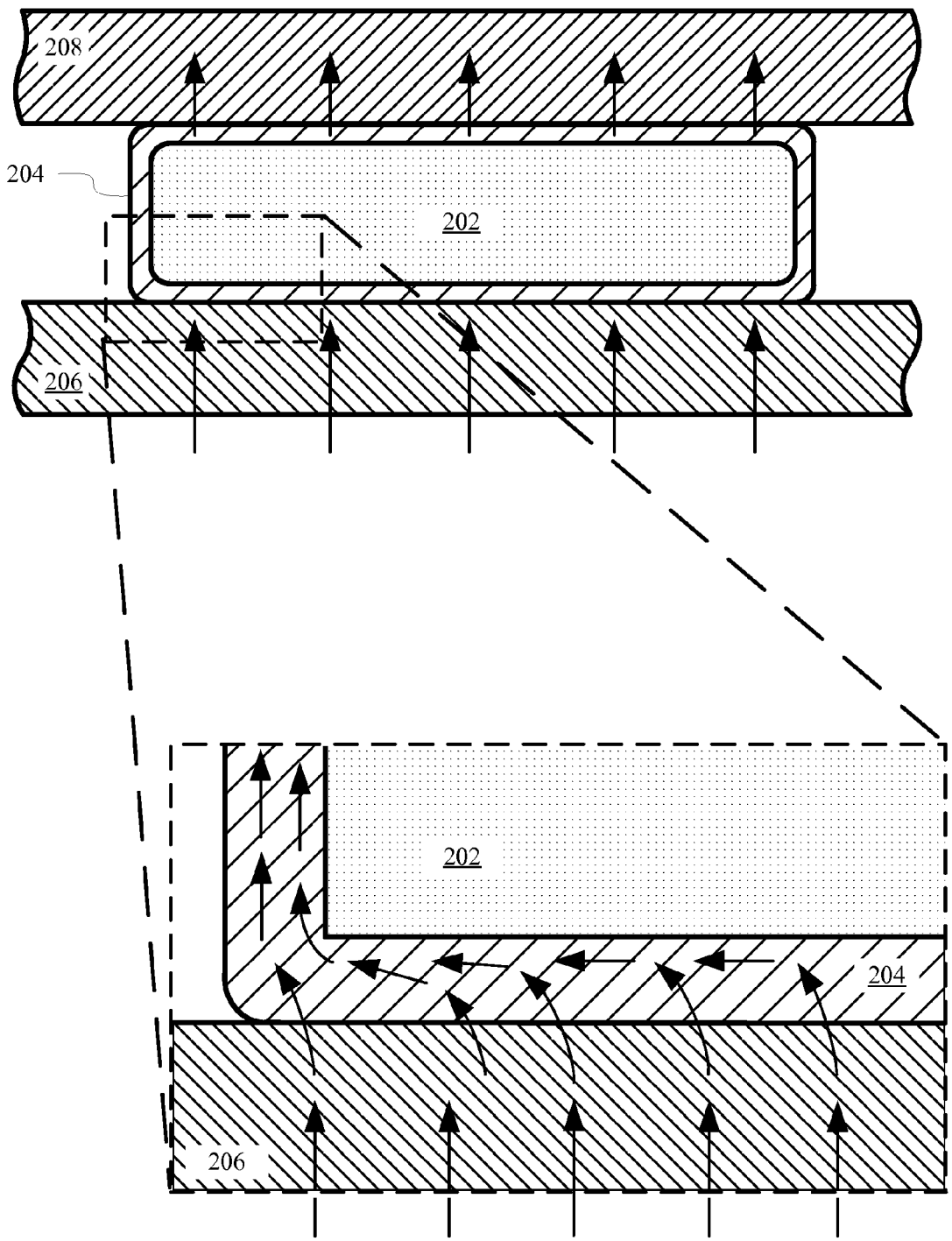
FIGS. 2A-2B show cross-sectional views and close up views describing heat transfer across a thermal gap pad.
Figure 2B:
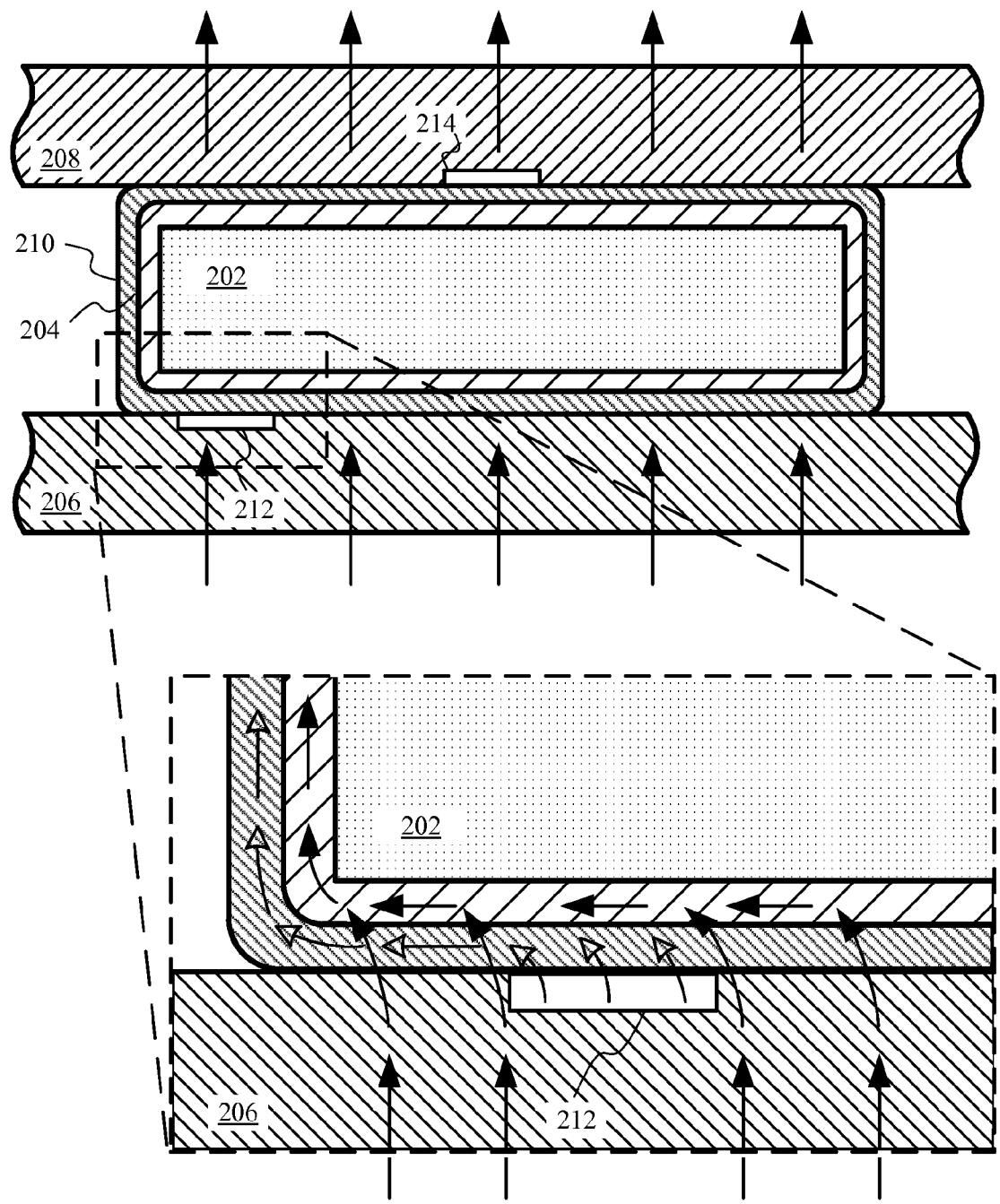

FIGS. 2A-2B show cross-sectional views of thermal gap pads conducting heat between two bodies. FIG. 2A shows a resilient core 202 surrounded by a thermally conductive layer 204. Resilient core 202 can be formed from foam or another material with elastic properties while thermally conductive layer 204 can be formed from synthetic graphite or any other material suitable for efficiently conducting heat and changing shape to accommodate compression or expansion of resilient core 202. In some embodiments, synthetic graphite can be more effective than graphite for this type of use since synthetic graphite is generally less brittle and more thermally conductive than naturally occurring graphite. Examples of materials suitable for use in forming thermally conductive layer 204 also include copper or aluminum weaves. In one specific embodiment, resilient core 202 can be formed from open cell or closed cell polyurethane foam. While a solid block of graphite or copper might be more effective at transferring large amounts of heat between body 206 and body 208, a solid metal or in some cases composite construct would not have the flexibility of the thermal gap pads described above. The close up view shows a portion of thermally conductive layer 204 and how heat (represented by black tipped arrows) is conducted along thermally conductive layer 204 when a temperature of body 206 is greater than a temperature of body 208. Because thermally conductive core 204 is so much more thermally conductive than resilient core 202 only a small amount of heat is transferred to resilient core 202. It should be noted that on the other side of the thermal gap pad heat would flow around the other side of the thermal gap pad, taking the shortest route from that portion of body 206 to body 208.

FIG. 2B shows a resilient core 202 surrounded by a thermally conductive layer 204, which is in turn surrounded by an electrically conductive layer 210 to form a resilient, electrically conductive thermal gap pad. The electrically conductive layer 210 can also have thermally conductive properties allowing heat to freely pass between electrically conductive layer 210 and thermally conductive layer 204. Furthermore, electrically conductive layer 210 can be substantially thinner than thermally conductive layer 204 to further ease passage of heat through the electrically conductive layer 210. While thermally conductive layer 204 may conduct a limited amount of electricity it should be appreciated that electrically conductive layer 210 will generally be much more efficient at conducting electricity than thermally conductive layer 204. In some embodiments, electrically conductive layer 210 can be formed from mesh allowing portions of the heat in body 206 to flow directly into thermally conductive layer 204. Likewise, thermally conductive layer 204 will be much more efficient at conducting heat. For example, in a configuration in which thermally conductive layer 204 is formed from synthetic graphite and electrically conductive layer 210 is formed from copper, thermally conductive layer 204 can have a thermal conductivity on the order of about five times greater than that of the copper layer. Similarly, a copper mesh or weave can have substantially greater electrical conductivity than synthetic graphite. FIG. 2B also depicts electrical traces 212 and 214 on bodies 206 and 208 respectively. In the close up view of FIG. 2B, electrical current (depicted by open arrows) flows primarily through electrically conductive layer 210 to reach electrical trace 214. In this way, an electrically conductive pathway can be established by the thermal gap pad to provide grounding and/or to transmit electrical signals. It should be noted that in another embodiment the resilient core can be doped with conductive particles and when compressed the resilient core can allow electrical current to flow directly through resilient core 202.

Figure 3:
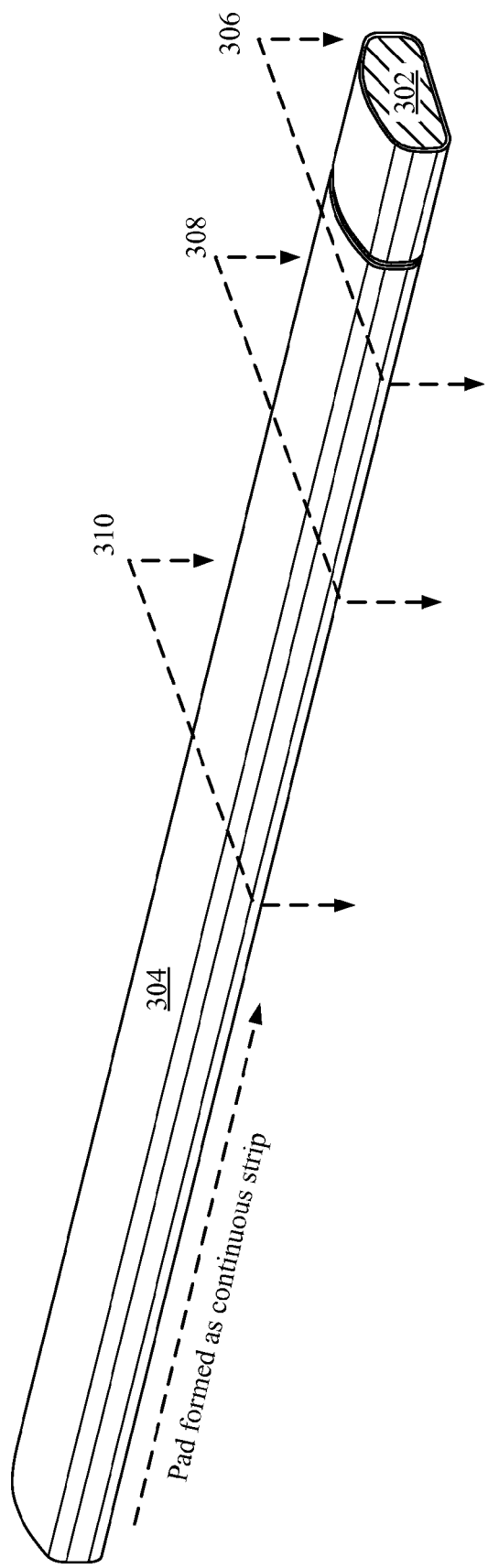
FIG. 3 shows one method for forming a number of thermal gap pads from a larger thermal gap pad.

FIG. 3 shows one way in which thermal gap pads can be formed. FIG. 3 depicts an extended resilient core wrapped in a thermally conductive layer 304. In one particular embodiment, thermally conductive layer 304 is formed from synthetic graphite fabric. Subsequent to forming the extended thermal gap pad, the extended pad can be sliced or cut at positions 306, 308 and 310 to form a number of smaller thermal gap pads. As depicted, cuts at 306 and 308 can form thermal gap pads of similar size while a cut at 310 can form a substantially elongated thermal gap pad. It should be noted that in some embodiments, thermally conductive layer 304 can be an unsealed layer of graphite fabric at this point in the assembly procedure. This allows the graphite fabric to be subsequently sealed once it is cut to an appropriate size.

Figure 4:
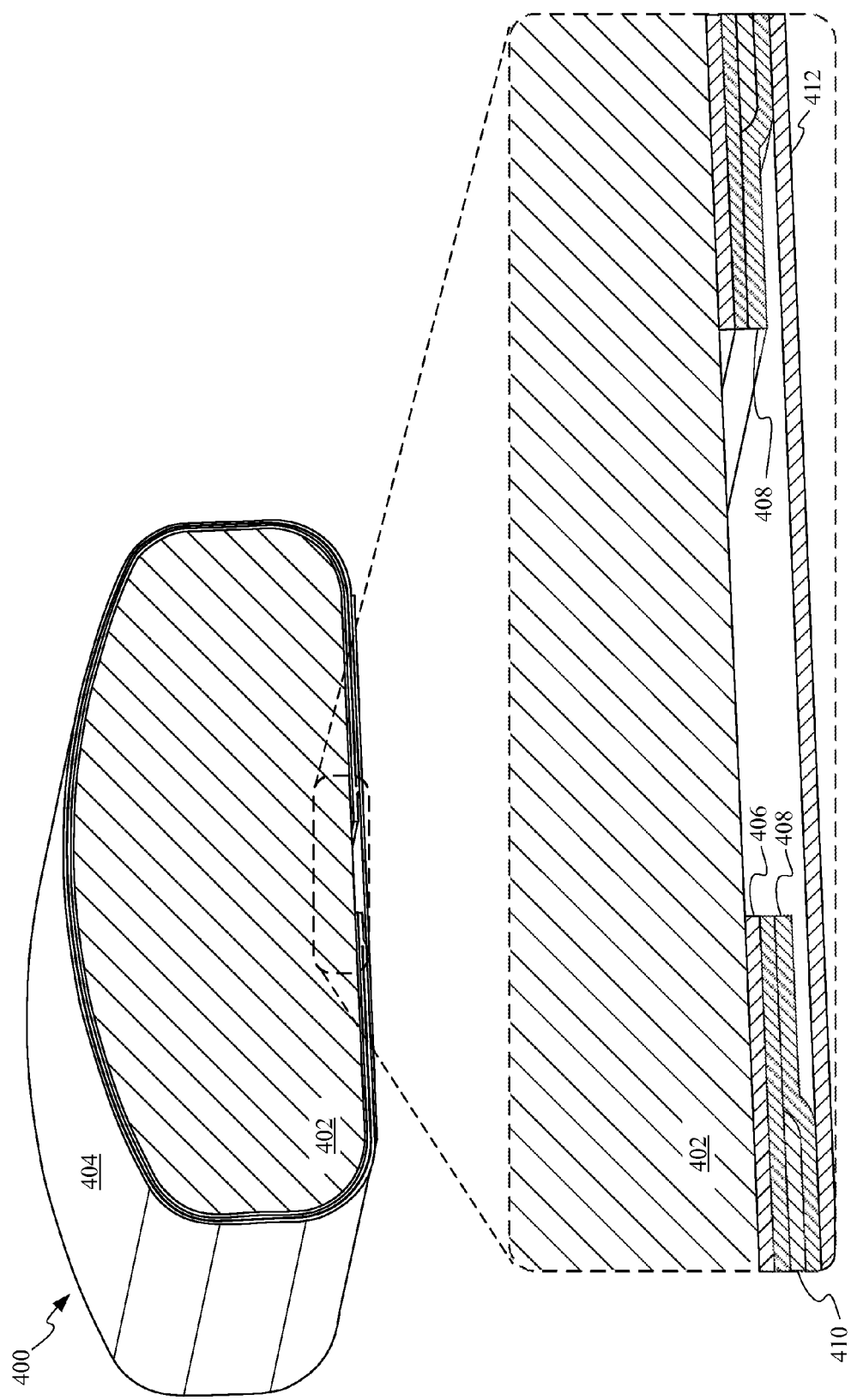
FIG. 4 shows a cross-sectional view of a specific embodiment of a thermal gap pad.

FIG. 4 shows a cross-sectional view of one particular embodiment of a thermal gap pad 400. Thermal gap pad 400 has a resilient core 402 that can be formed of any number of materials, such as for example open or closed cell polyurethane foam. Thermally conductive layer 404 can be wrapped around resilient core 402 and joined to resilient core 402 by adhesive layer 406. Thermally conductive layer 404 can include highly conductive layer 410 laminated to and encased within a flexible wrapper 408. In some embodiments, flexible wrapper 408 can be made from a polymeric material such as polyethylene terephthalate (PET). Flexible wrapper 408 can prevent small pieces and/or dust from highly thermally conductive layer 410 from migrating into other portions of electronic device 100. For example, when highly conductive layer 410 is formed from synthetic graphite and exposed to an interior portion of electronic device 100, small pieces of the synthetic graphite can separate from highly conductive layer 410 and contaminate electronic device 100, in some cases causing undesirable component failure. Thermal gap pad 400 can also include an additional adhesive layer 412 disposed along an outside surface of thermally conductive layer 404. Adhesive layer 412 can be configured to adhere thermal gap pad 400 to another component in electronic device 100. Adhesive layer 412 can be formed of adhesive material having high thermal conductivity as it is disposed between a heat emitting or heat receiving component. In some embodiments, a number of exterior adhesive layers can be used to affix thermal gap pad to a number of surfaces; however, it should be noted that by adhering thermal gap pad 400 to a single surface, the components between which the thermal gap pad facilitates thermal transfer can be easily separated.

FIG. 4 also depicts thermally conductive layer 404 not wrapping entirely around resilient core 402. This can be a consequence of flexible wrapper 408 that encloses the graphite sheet or fabric; however, in some embodiments, the graphite can be extruded so that it reaches continuously around resilient core 402 as depicted in FIGS. 2A-2B. In this way, heat can be spread in any direction. It should be noted that by separating ends of thermally conductive layer 404 a direction of heat flow from a bottom surface of thermal gap pad 400 to a top surface of thermal gap pad 400 is limited to flowing between components in one direction. It should also be noted that a distance between the ends of the thermally conductive layer 404 can vary, but would generally tend to be close together to maximize heat transfer from a substrate to which thermal gap pad 400 is affixed. FIG. 4 also shows a substantial curvature across a top portion of thermal gap pad 400 giving thermal gap pad 400 a substantially D-shaped geometry. This curvature also allows the foam to come in gradual contact with a surface to which it is compressed against. The curvature also allows for variability in an orientation of a component with which it is put into contact. For example, if two component assemblies are not parallel to one another contact between the component assemblies and thermal gap pads is still robust, whereas a rectangular gap pad might cause a substantially smaller amount of surface area of the gap pad to come into contact with the component assemblies. Furthermore, the D-shaped curvature of the top portion of thermal gap pad 400 can reduce a risk of collapse of the center section of resilient core 402 during compression of thermal gap pad 400.

Figure 5A:
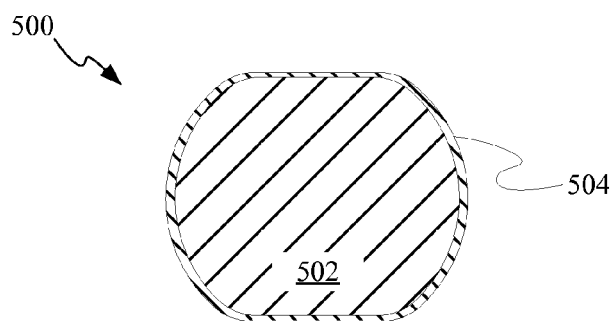
FIGS. 5A-5C show a variety of cross-sectional shapes suitable for use with the described embodiments.
Figure 5B:
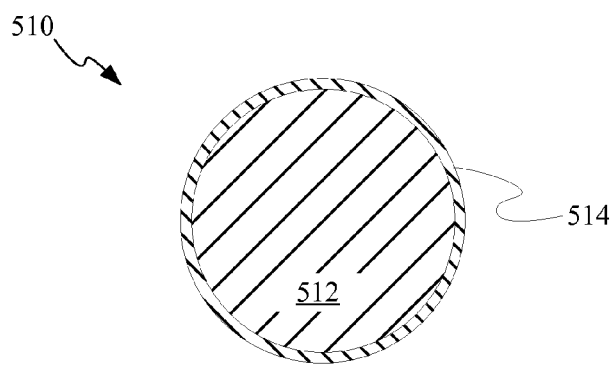
Figure 5C:
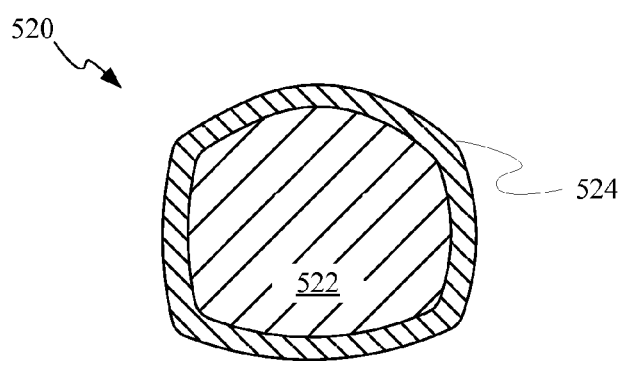

FIGS. 5A-5C show various cross-sectional shapes that the thermal gap pad can assume. FIG. 5A shows a thermal gap pad 500 having a resilient core 502 with a flattened top and bottom surface and curved side surfaces surrounded by thermally conductive layer 504. This configuration might be appropriate where thermal gap pad 500 is adhered to a sidewall and then two components adjacent to the sidewall are in close proximity and placed in thermal contact by the thermal gap pad 500. This would allow the thermal gap pad 500 to have a flat mounting surface and curved sides that engage the two components. FIG. 5B shows a substantially circular cross-section. Such a configuration allows thermal gap pad 510 to be oriented in any orientation. Thermal gap pad 510 can also be easily positioned within a curved channel. FIG. 5C shows a top surface of thermal gap pad 520 having a greater curvature than a bottom surface. In some embodiments, the bottom surface can be better suited for adhesion to a flat surface while the top surface provides a more variable amount of compression to be experienced by resilient core 522 as it is compressed between components.

Figure 6A:
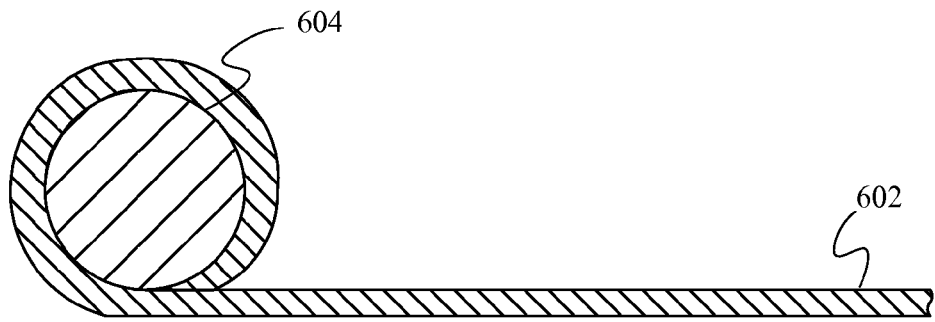
FIGS. 6A-6B show how a heat spreader can be combined with a thermal gap pad.
Figure 6B:
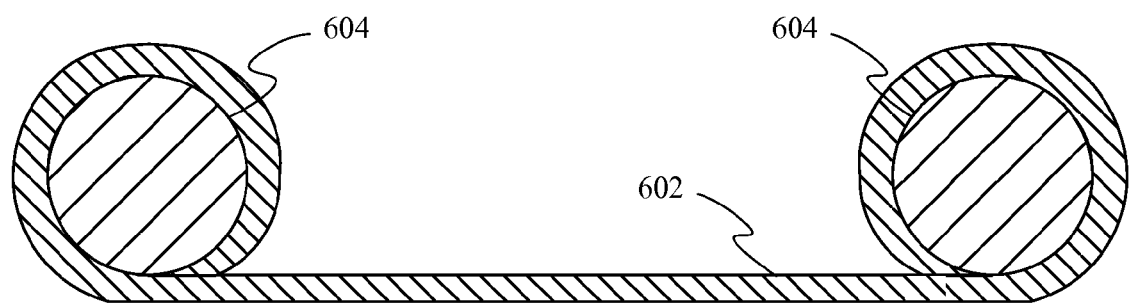

FIGS. 6A-6B show how a thermal gap pad can be integrated with a heat spreading pad. FIG. 6A shows heat spreading pad 602. In one embodiment, heat spreading pad can be formed from a sheet of synthetic graphite fabric encased in a flexible wrapper. One end of heat spreading pad 602 can be wrapped around a resilient core 604. When resilient core 604 bridges a gap between two components, heat transferred to heat spreading pad 602 from one component can be transferred to the other component by way of the raised end of heat spreading pad 602. This configuration can be ideal where the two components are in close proximity only in a limited number of locations including at the raised end of heat spreading pad 602. Heat spreading pad in this case gathers heat from a large area and then channels the heat collected by heat spreading pad 602 through the raised end of heat spreading pad 602 to the other component. FIG. 6B shows how two ends of heat spreading pad 602 can be wrapped about resilient cores 604. When both ends of heat spreading pad 602 are in contact with the other component, or in some embodiments in thermal contact with multiple other components, the additional thermal pathway can increase a speed at which heat can be distributed throughout a device. In some embodiments, the resilient cores 604 can be positioned upon opposite sides of a component so that heat spreading pad 602 covers the area between resilient cores 604 and conducts heat towards resilient cores 604 positioned along the periphery of the component.

Figure 7:
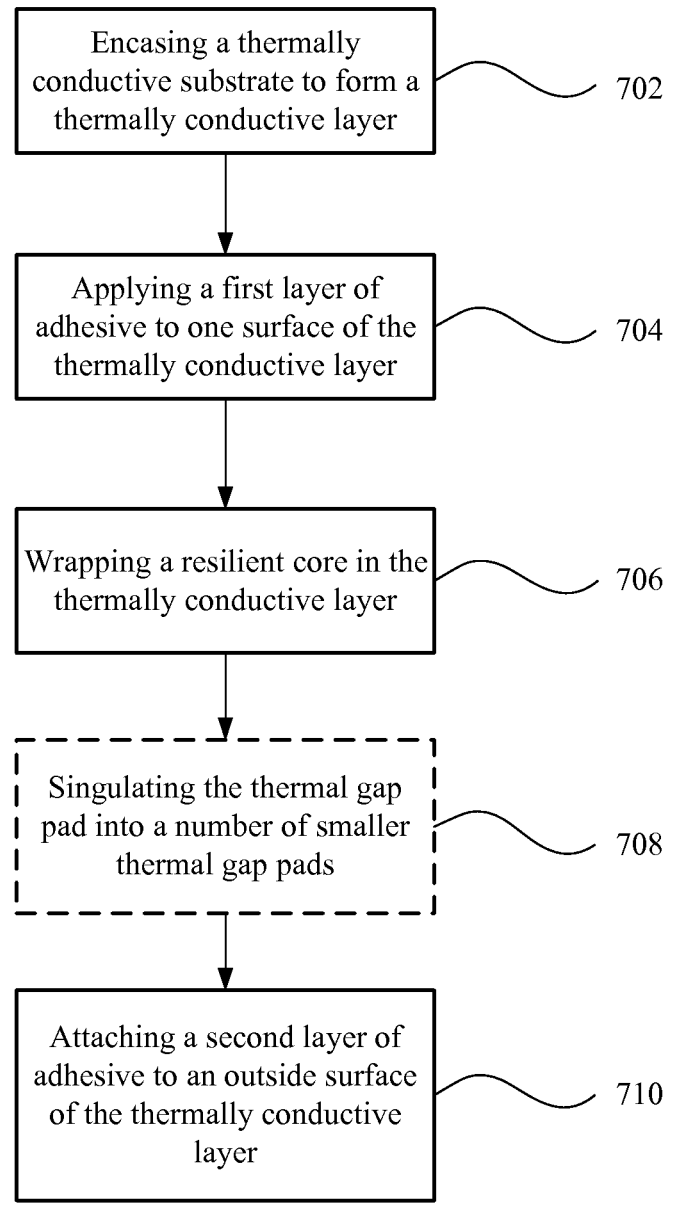
FIG. 7 shows a block diagram representing a method for forming a thermal gap pad.

FIG. 7 shows a block diagram representing a method for assembling a thermal gap pad suitable for use in an electronic device. In a first step 702 a thermally conductive substrate is laminated within a thin and flexible wrapper to form a thermally conductive layer. The thermally conductive substrate can be formed from any number of materials having high thermal conductivity; however in one specific embodiment the thermally conductive substrate can be formed from Pyrolytic Highly Oriented Graphite Sheet (PGS). Other possible materials suitable for forming the thermally conductive substrate can include weaves of copper, aluminum and other forms of synthetic graphite. The flexible wrapper can be made from a thin layer of polyethylene terephthalate (PET) and can prevent dust particles from escaping into the electronic device by sealing the thermally conductive substrate within the flexible wrapper. At step 704 a first layer of adhesive is laminated to one surface of the thermally conductive layer.

At step 706 the thermally conductive layer is wrapped around a resilient core, the laminated first layer of adhesive being operable to adhesively couple the thermally conductive layer with the resilient core. The resilient core can be formed from any of a number of materials including closed cell or open cell polyurethane foam (or similar compliant/resilient material). During the wrapping operation the resilient core can be forced into a 'D' shape (similar to the shape depicted in FIG. 4) with an arc on the top side, opposite the adhesive. Other shapes, similar to those depicted in FIGS. 5A-5C can be formed in a similar manner. In some embodiments, an open cell polyurethane foam can be a preferable material for forming the resilient core, as open cell polyurethane foam tends to retain its resilience after being compressed, allowing it to maintain a compression of the thermally conductive layer against components between which it conducts heat. The resilient core will generally have a constant cross-section that allows it to conform with a location in which it will be disposed; however, in some embodiments, a portion of the resilient core can have a varying cross-sectional shape that conforms with an internal feature of the electronic device. In some embodiments cross-sectional variance can require multiple wrapping operations corresponding to different cross-sectional sizes.

At optional step 708, the resulting thermal gap pad can be singulated into a number of smaller thermal gap pads for assembly into various positions within the electronic device. It should be noted that in some embodiments, separation of the thermal gap pad into multiple smaller pads can break the seal formed by the flexible wrapper. In this case, open edges of the flexible wrapper can be resealed to prevent contamination of the electronic device as described above.

Finally, at step 710 another layer of adhesive is attached to an outer surface of the flexible wrapper that allows the thermal gap pad to be adhesively coupled to an internal component of the electronic device and in a position so that it can create a thermally conductive pathway between at least two components of the electronic device. It should be noted that a distribution of a number of thermal gap pads can be arranged so that a greater percentage of surface area is covered by the thermal gap pads where emitted heat is greatest. Such a distribution can be based upon a thermal analysis of the electronic device that indicates which areas of the device receive the most heat, or even more specifically which portions of the two components have the greatest temperature imbalance during normal operation of the electronic device.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium executed by a processor for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device comprising:
   an electronic component;
   a heat generating component comprising a first region and a second region, wherein the first region emits a greater amount of heat than the second region; and
   multiple heat transfer composite structures compressed between the electronic component and the heat generating component with the heat transfer composite structures being distributed more densely in the first region than in the second region, the heat transfer composite structures providing thermal paths for transfer of heat in the electronic device, each heat transfer composite structure comprising:
   a resilient bulk portion comprising a substrate formed of a material that is thermally insulating; and
   a laminate structure that promotes efficient heat transfer along the thermal path, the laminate structure comprising a thermally conductive layer sealed within a flexible wrapper,
   wherein the laminate structure is wrapped around and adhered to the resilient bulk portion in a manner that defines the thermal path.

2. The electronic device as recited in claim 1, each heat transfer composite structure further comprising an adhesive layer disposed along an outside surface of the laminate structure and configured to adhere the heat transfer composite structure to the heat generating component.

3. The electronic device as recited in claim 2, wherein the resilient bulk portion compresses the laminate structure against both the electronic component and the heat generating component.

4. The electronic device as recited in claim 3, each heat transfer composite structure further comprising:
   an electrically conductive layer wrapped around the laminate structure,
   wherein the resilient bulk portion compresses the electrically conductive layer between the laminate structure and the electronic component and the heat generating component.

5. The electronic device as recited in claim 3, wherein the laminate structure extends away from the bulk portion and covers at least a portion of a heat-emitting surface of the heat generating component, the thermally conductive layer being operable to gather heat from the heat-emitting surface and conduct the heat to the electronic component.

6. The electronic device as recited in claim 5, wherein the laminate structure is wrapped around another resilient bulk portion disposed at an end of the laminate structure opposite the resilient bulk portion.

7. The electronic device as recited in claim 1, wherein the resilient bulk portion comprises polyurethane foam.

8. The electronic device as recited in claim 1, wherein the resilient bulk portion has a substantially continuous cross-sectional shape.

9. The electronic device as recited in claim 1, wherein the thermally conductive layer comprises at least one sheet of synthetic graphite fabric.

10. A computing device having an integrated circuit, a first electronic component and a second internal component separated from the first electronic component by a gap, the integrated circuit having a first region and a second region, the first region emitting a greater amount of heat than the second region, the first electronic component being in thermally conductive contact with the integrated circuit, the computing device comprising:
    multiple thermal gap pads compressed in and filling the gap, the multiple gap pads being more densely arranged within the first region than the second region, each thermal gap mad comprising:
    a resilient core, and
    a thermally conductive layer sealed within a flexible wrapper, the thermally conductive layer having a substantially greater thermal conductivity than the resilient core,
    wherein the greater conductivity of the thermally conductive layer results in a majority of the heat conducted by the thermal gap pad remaining within the thermally conductive layer when the heat is conducted between the first electronic component and the second internal component.

11. The computing device as recited in claim 10, wherein the thermally conductive layer conducts heat generated by the integrated circuit to the first component.

12. The computing device as recited in claim 10, wherein the thermal conductivity of the thermally conductive layer is over 1000 times higher than the thermal conductivity of the resilient core.

13. The computing device as recited in claim 10, wherein a size of the gap is subject to change during operation of the computing device.

14. An electronic device, having a housing defining a front opening, a display assembly disposed within the front opening, and a first internal component coupled to the display assembly and disposed within the housing, the first internal component having a first region and a second region, the first region emitting a greater amount of heat than a second region, the electronic device comprising:
   multiple thermal gap pads compressed between the first internal component and the display assembly, the thermal gap pads being distributed more densely in the first region than the second region and each thermal gap pad comprising:
      a resilient bulk portion, and
      a thermally conductive structure sealed within a flexible wrapper, the thermally conductive structure wrapped around and adhered to the resilient bulk portion, the thermally conductive structure comprising a thermally conductive layer having a thermal conductivity more than 1000 times greater than a thermal conductivity of the resilient bulk portion.

15. The electronic device as recited in claim 14, wherein the first component overlays and is in thermally conductive contact with a printed circuit board (PCB).

16. The electronic device as recited in claim 14, wherein the thermally conductive structure comprises a layer of thermally conductive material selected from the group consisting of copper, aluminum and graphite.

17. The electronic device as recited in claim 14, wherein the thermally conductive structure comprises an outer layer of electrically conductive material that electrically grounds the first component to the display assembly.

18. The electronic device as recited in claim 14, wherein the resilient bulk portion comprises a material selected from the group consisting of closed cell foam and open cell foam.

* * * * *